United States Patent

Khoury et al.

[11] Patent Number: 5,989,994
[45] Date of Patent: Nov. 23, 1999

[54] METHOD FOR PRODUCING CONTACT STRUCTURES

[75] Inventors: Theodore A. Khoury, Chicago; Mark R. Jones, Mundelein; James W. Frame, Chicago, all of Ill.

[73] Assignee: Advantest Corp., Tokyo, Japan

[21] Appl. No.: 09/222,176

[22] Filed: Dec. 29, 1998

[51] Int. Cl.⁶ .................................................. H01L 21/44
[52] U.S. Cl. ........................ 438/615; 438/670; 438/676; 257/775
[58] Field of Search .............................. 438/15, 615, 666, 438/670, 676, 685, 686, 687, 688; 257/737, 775; 439/45, 46; 29/840, 843

[56] References Cited

U.S. PATENT DOCUMENTS

| | | | |
|---|---|---|---|
| 5,127,998 | 7/1992 | Cole | 205/135 |
| 5,230,965 | 7/1993 | Cole | 428/601 |
| 5,829,128 | 11/1998 | Eldridge | 29/855 |
| 5,832,601 | 11/1998 | Eldridge | 29/843 |
| 5,846,879 | 12/1998 | Winnerl | 430/666 |
| 5,878,486 | 4/1999 | Eldridge | 29/840 |
| 5,884,398 | 4/1999 | Eldridge | 29/843 |
| 5,897,326 | 4/1999 | Eldridge | 438/14 |

*Primary Examiner*—Charles Bowers
*Assistant Examiner*—Nema Berezny
*Attorney, Agent, or Firm*—Muramatsu & Associates

[57] ABSTRACT

A production method for forming contact structures on a planar surface of a substrate. The production method includes the steps of: (a) forming a sacrificial layer on a surface of a silicon substrate, (b) forming an conductive layer made of electric conductive material on the sacrificial layer, (c) forming a photoresist layer on the conductive layer, (d) aligning a photo mask over the photoresist layer and exposing the photoresist layer with ultraviolet light through the photo mask where the photo mask including an image of the contact structures, (e) developing the image on the photoresist layer which has openings on the surface of the photoresist layer, (f) forming the contact structures made of electric conductive material in the openings by an electroplating process, (g) stripping the photoresist layer, (h) placing an adhesive tape on the contact structure, and (i) removing the sacrificial layer and the conductive layer by an etching process to separate the contact structures on the adhesive tape from the silicon substrate.

22 Claims, 9 Drawing Sheets

METHOD FOR PRODUCING CONTACT STRUCTURES

FIELD OF THE INVENTION

This invention relates to a method for producing contact structures, and more particularly, to a method for producing a large number of contact structures on a semiconductor wafer in a horizonal direction, transferring the contact structures from the wafer to an adhesive tape, and removing the contact structures from the adhesive tape to be mounted on a probe card, IC chip, or other contact mechanism in a vertical direction.

BACKGROUND OF THE INVENTION

In testing high density and high speed electrical devices such as LSI and VLSI circuits, a high performance probe card having a large number of contact structures must be used. In other application, contact structures may be used for IC packages as IC leads. The present invention is directed to a production process of such contact structures to be used in testing LSI and VLSI chips, semiconductor wafers, burn-in of semiconductor wafers and die, testing and burn-in of packaged semiconductor devices, printed circuit boards and the like, as well as used in forming leads of IC chips or IC packages.

The inventors of this application have proposed a new type of contact structure to be used in such applications in U.S. patent application No. 09/099,614 filed Jun. 19, 1998, entitled "Probe Contactor Formed by Photolithography Process", U.S. patent application No. 09/140,961 filed Aug. 27, 1998, entitled "High Performance Integrated Circuit Chip Package", and U.S. patent application No. 09/157,842 filed Sep. 21, 1998, entitled "Packaging and Interconnection of Contact Structure". This invention is directed to a method of producing contact structures shown in such patent applications.

In the above noted patent applications, the inventors have proposed a unique type of contact structures as shown in FIG. 1. The example of FIG. 1 shows the application in which contact structures 30 are mounted on a probe card to electrically contact the targets such as contact pads 320 on a printed circuit board 300. The contact structures 30 are formed through a photolithography process on a semiconductor substrate 20, which is fully described in the above patent applications.

Although the production methods introduced in the above noted patent applications appear to be successful, the methods require relatively many lithography steps to form the structure in a vertical direction on the substrate. The inventors have attained a more simplified and low cost production process which is also able to achieve contact structures of higher reliability because of the simplified production process.

SUMMARY OF THE INVENTION

Therefore, it is an object of the present invention to provide a method for producing a large number of contact structures by using relatively simple technique.

It is another object of the present invention to provide a method for producing a large number of contact structures in a two dimensional manner rather than a three dimensional manner on a planar surface of a silicon substrate.

It is a further object of the present invention to provide a method for producing a large number of contact structures in a two dimensional manner on a silicon substrate, transferring the contact structure from the silicon substrate to an adhesive tape or plate, and removing the contact structures from the adhesive tape or plate to be mounted on a probe card or other contact mechanism.

It is a further object of the present invention to provide a method for producing a large number of contact structures with low cost and high efficiency.

It is a further object of the present invention to provide a method for producing a large number of contact structures of high mechanical strength and reliability.

It is a further object of the present invention to provide a method of producing contact structures to be used in testing and burn-in semiconductor wafers, packaged LSIs and the like.

In the present invention, contact structures for testing (including burn-in) a semiconductor wafers, packaged LSIs or printed circuit boards (devices under test) are formed on a planar surface of a silicon substrate by a photolithography technology established in the semiconductor production process.

The production method of the present invention is comprised of the steps of:

(a) forming a sacrificial layer on a surface of a silicon substrate;

(b) forming an conductive layer made of electric conductive material on the sacrificial layer;

(c) forming a photoresist layer on the conductive layer;

(d) aligning a photo mask over the photoresist layer and exposing the photoresist layer with ultraviolet light through the photo mask, the photo mask including an image of the contact structures;

(e) developing the image on the photoresist layer which has openings on the surface of the photoresist layer;

(f) forming the contact structures made of electric conductive material in the openings by an electroplating process;

(g) stripping the photoresist layer;

(h) placing an adhesive tape on the contact structure so that upper surfaces of the contact structures adhere to the adhesive tape; and (i) removing the sacrificial layer and conductive layer by an etching process so that the contact structures on the adhesive tape are separated from the silicon substrate.

The etching process in the foregoing may be formed of a first etching process for separating the contact structures from the silicon substrate and a second etching process for separating the contact structures from the conductive layer.

Another aspect of the present invention is a process of producing a contact mechanism having contact structures each of which is able to exhibit a spring force for establishing electrical contact with a contact target. The production process is comprised of the following steps of:

(a) forming a sacrificial layer on a surface of a silicon substrate;

(b) forming an conductive layer made of electric conductive material on the sacrificial layer;

(c) forming the contact structures through a photolithography process, the contact structures being in a horizontal directions on the silicon substrate;

(d) transferring the contact structures from the silicon substrate to an adhesive tape;

(e) positioning the adhesive tape having the contact structures and removing the contact structures therefrom;

(f) orienting the contact structures in a predetermined direction;

(g) positioning a contact mechanism having bonding locations for mounting the contact structures thereon; and (h) placing the contact structure on a predetermined position on the bonding location of the contact mechanism and bonding the contact structure to the bonding location.

According to the present invention, the production process is able to produce a large number of contact structures in a horizontal direction on the silicon substrate by using relatively simple technique. Such contact structures produced are removed from the substrate and mounted on a contact mechanism such as a probe card in a vertical direction. The contact structures produced by the present invention are low cost and high efficiency and have high mechanical strength and reliability. The contact structures produced by the method of the present invention are advantageously applied in testing a semiconductor wafer, packaged LSI and the like including burn-in testing.

DETAILED DESCRIPTION OF THE PREFERRED EMBODIMENT

Figure 1:
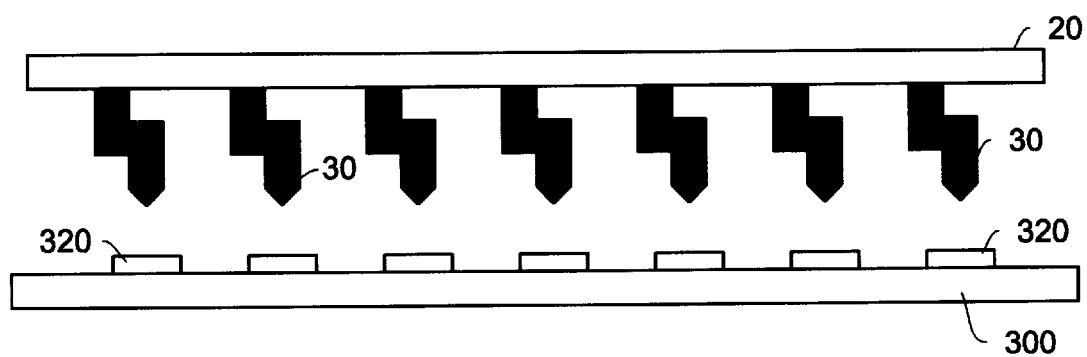
FIG. 1 is a schematic diagram showing a structural relationship between a probe card mounting contact structures and contact targets such as a semiconductor wafer.

Each of the contact structures 30 of FIG. 1 exhibits contact pressure produced by a spring force derived mainly from a horizontal beam thereof when the contact structure is pressed against contact pad 320 on the printed circuit board 300. The contact pressure also creates a scrubbing effect at the tip of the contact structure against the surface of contact pad 320. The contact structures may take various shapes such as shown in FIGS. 7A–7F.

Figure 2A:
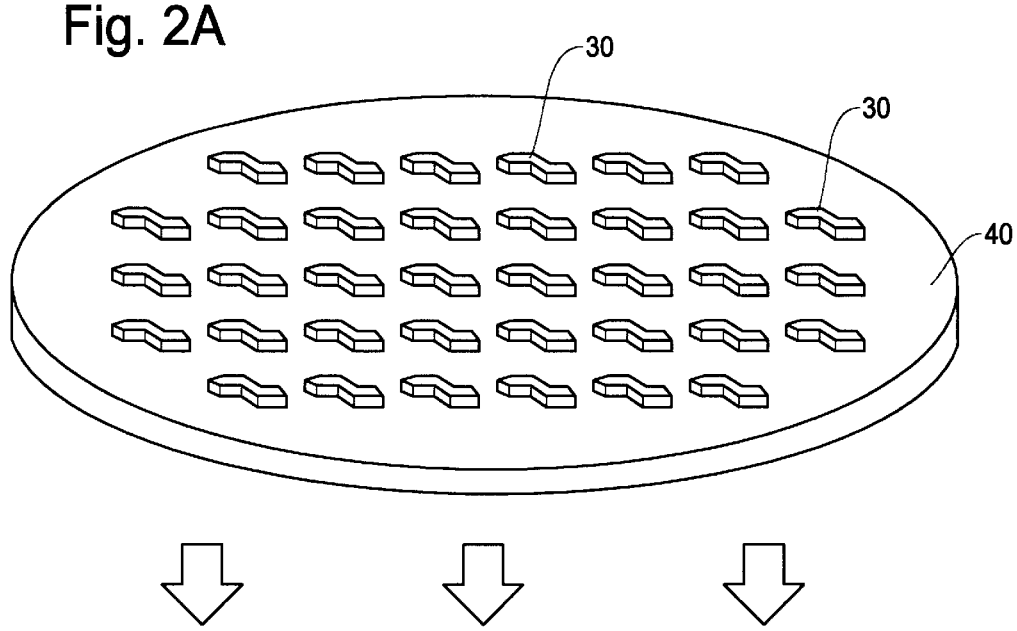
FIGS. 2A and 2B are schematic diagrams showing a basic idea of production method of the present invention in which a large number of contact structures are formed on a planar surface of a silicon substrate and removed therefrom.
Figure 2B:
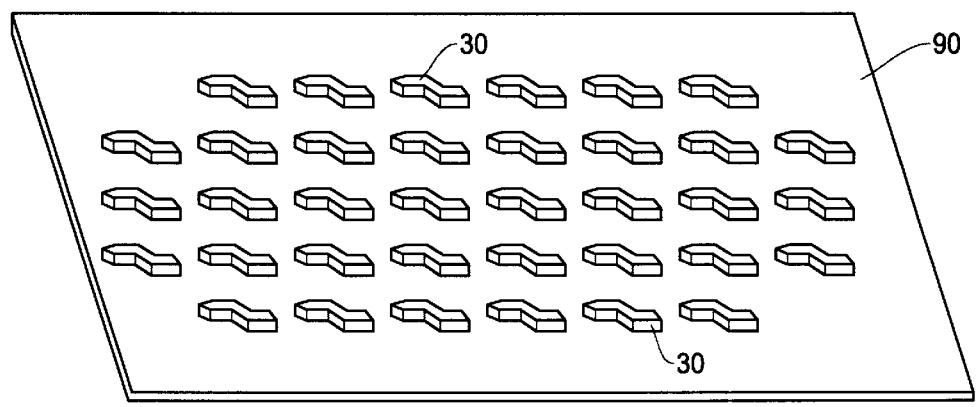

FIG. 2 shows a basic idea of the present invention for producing such contact structures. In the present invention, as shown in FIG. 2A, contact structures are produced on a planar surface of a silicon substrate in a horizontal direction, i.e., in a two dimensional manner. Then, as shown in FIG. 2B, the contact structures are transferred from the substrate to an adhesive member, such as an adhesive tape, adhesive film and adhesive plate (collectively "adhesive tape"). The contact structures on the adhesive tape are is removed therefrom to be mounted on a printed circuit board, IC chip, or other contact mechanism in a vertical direction, i.e., in a three dimensional manner.

Figure 3A:
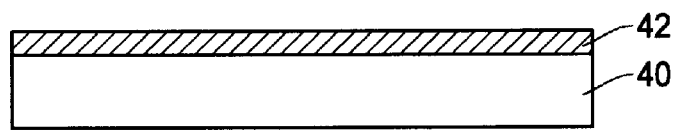
FIGS. 3A–3L are schematic diagrams showing an example of production process of the present invention for producing the contact structures.

FIGS. 3A–3L are schematic diagrams showing an example of production process for producing the contact structure of the present invention. In FIG. 3A, a sacrificial layer 42 is formed on a silicon substrate 40. The sacrificial layer 42 is made, for example, of silicon dioxide ($SiO_2$) through a deposition process such as a chemical vapor deposition (CVD) The sacrificial layer 42 is to separate the contact structures from the silicon substrate in the later stage of the production process.

Figure 3B:
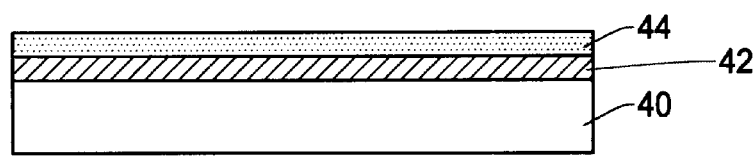
Figure 3C:
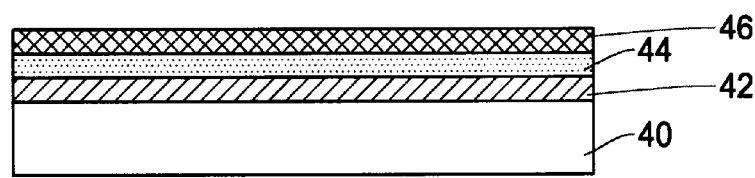

An adhesion promoter layer 44 is formed on the sacrificial layer 42 as shown in FIG. 3B through, for example, an evaporation process. An example of material for the adhesion promoter layer 44 includes chromium (Cr) and titanium (Ti) with a thickness of 200–1,000 angstrom. The adhesion promoter layer 44 is to facilitate the adhesion of conductive layer 46 of FIG. 3C on the silicon substrate 40. The conductive layer 46 is made, for example, of copper (Cu) or nickel (Ni), with a thickness of 1,000–5,000 angstrom. The conductive layer 46 is to establish electrical conductivity for an electroplating process in the later stage.

Figure 3D:
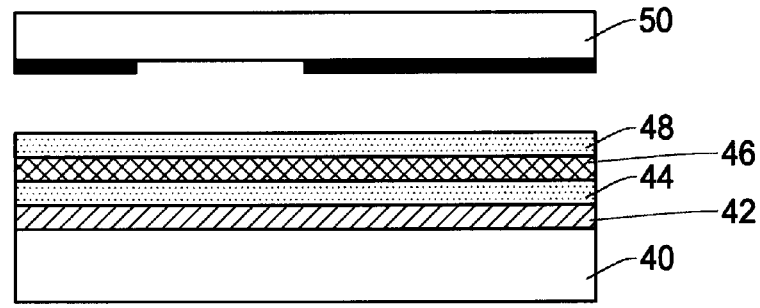
Figure 3E:
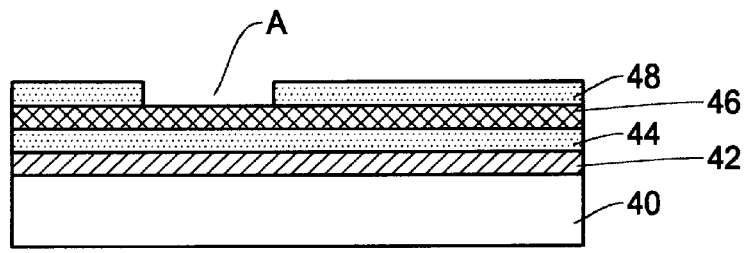
Figure 3F:
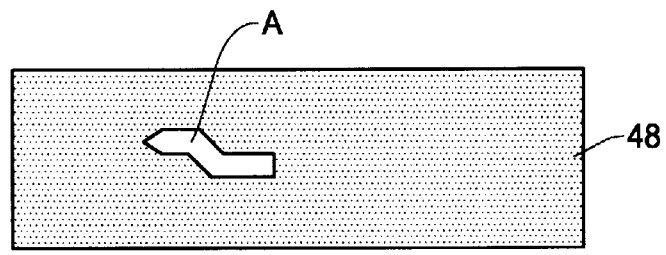

In the next process, a photoresist layer 48 is formed on the conductive layer 46 over which a photo mask 50 is precisely aligned to be exposed with ultraviolet (UV) light as shown in FIG. 3D. The photo mask 50 shows a two dimensional image of the contact structure 30 which will be developed on the photoresist layer 48. As is well known in the art, positive as well as negative photoresist can be used for this purpose. If a positive acting resist is used, the photoresist covered by the opaque portions of the mask 50 harden (cure) after the exposure. Examples of photoresist material include Novolak (M-Cresol-formaldehyde), PMMA (Poly Methyl Methacrylate), SU-8 and photo sensitive polyimide. The exposed part of the resist can be dissolved and washed away, leaving a photoresist layer 48 of FIG. 3E having an opening A (development process). FIG. 3E is a top view showing the photoresist layer 48 of FIG. 3F wherein the opening A having the shape of the contact structure 30 is shown.

In the photolithography process in the foregoing, instead of the UV light, it is also possible to expose the photoresist layer 48 with an electron beam or X-rays as is known in the art. Further, it is also possible to directly write the image of the contact structure on the photoresist layer 48 by exposing the photoresist 48 with a direct write electron beam, X-ray or light source (laser).

Figure 3G:
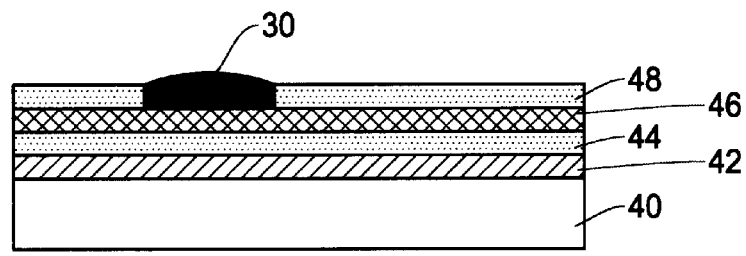
Figure 3H:
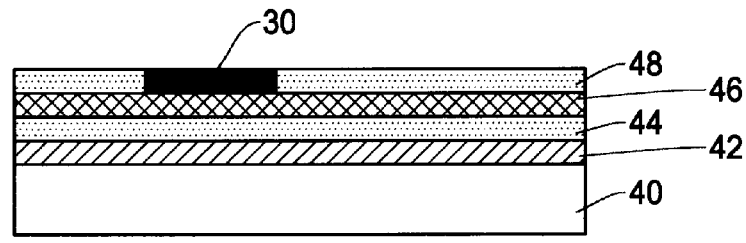

The contactor material such as copper (Cu), nickel (Ni), aluminum (Al), rhodium (Rh), palladium (Pd), tungsten (W) or other metal is deposited (electroplated) in the opening A of the photoresist layer 48 to form the contact structure 30 as shown in FIG. 3G. It can be beneficial for the contact material to be different from that of the conductive layer 46 to differentiate etching characteristics from one another as will be described later. The over plated portion of the contact structure 30 in FIG. 3G can be taken out in the grinding (planarizing) process of FIG. 3H.

Figure 3I:
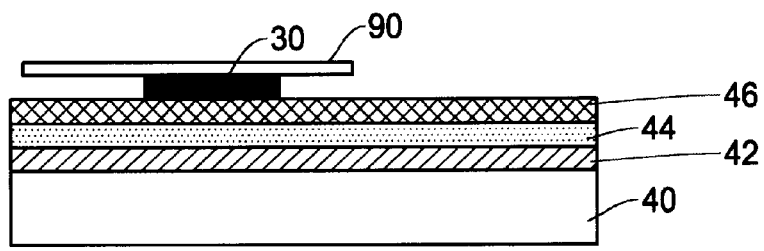
Figure 3J:
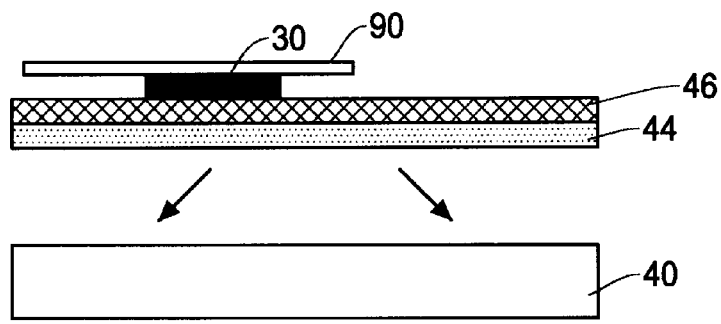
Figure 3K:
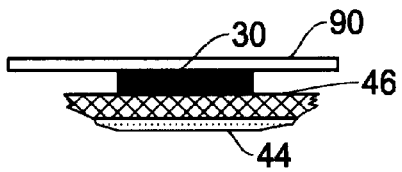
Figure 3L:
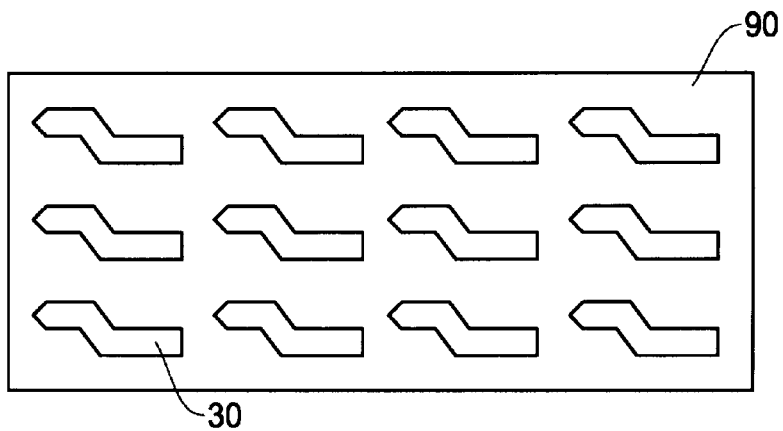

The photoresist layer 48 is removed in a resist stripping process shown in FIG. 3I. Typically, the resist layer 48 is removed by wet chemical processing. Other examples are acetone-based stripping and plasma $O_2$ stripping. Further in FIG. 3I, an adhesive tape 90 is placed on an upper surface of the contact structure 30 so that the contact structure 30 adhere to the adhesive tape 90. As noted above, within the context of the present invention, the adhesive tape 90 includes other types of adhesive member, such as an adhesive film and adhesive plate In the process shown in FIG. 3J, the sacrificial layer 42 is etched away so that the contact structure 30 on the adhesive tape 90 is separated from the silicon substrate 40. Another etching process is conducted so that the adhesion promoter layer 44 and the conductive layer 46 are removed from the contact structure 30 as shown in FIG. 3K.

The etching material can be selected to etch the layers 44 and 46 but do not etch the contact structure 30. In other words, to etch the conductive layer 46 without etching the contact structure 30, as noted above, the conductive material used for the contact structure 30 must be different from the material of the conductive layer. Although the production process in FIGS. 3A–3I shows only one contact structure, in an actual production process, as shown in FIGS. 1A and 1B, a large number of contact structures are produced at the same time. Thus, a large number of contact structures 30 are transferred to the adhesive tape 90 and separated from the silicon substrate and other materials as shown in the top view of FIG. 3L.

Figure 4A:
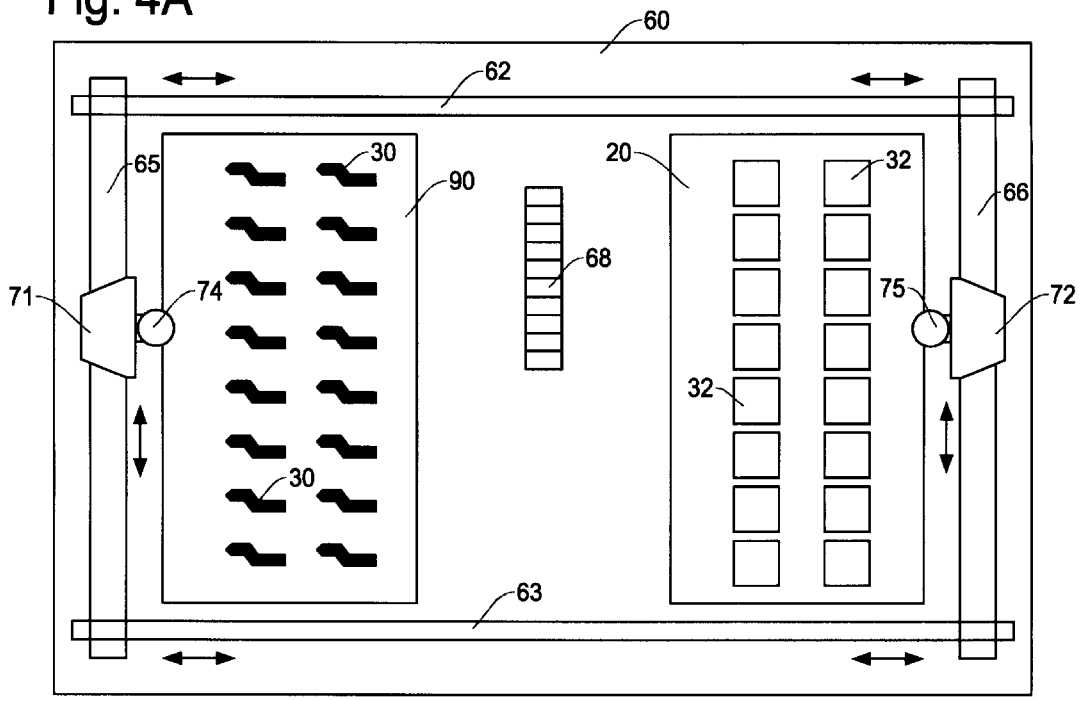
FIGS. 4A and 4B are schematic diagrams showing an example of pick and place mechanism and its process for picking the contact structures and placing the same on a substrate such as a probe card to mount the contact structures on the substrate.
Figure 4B:
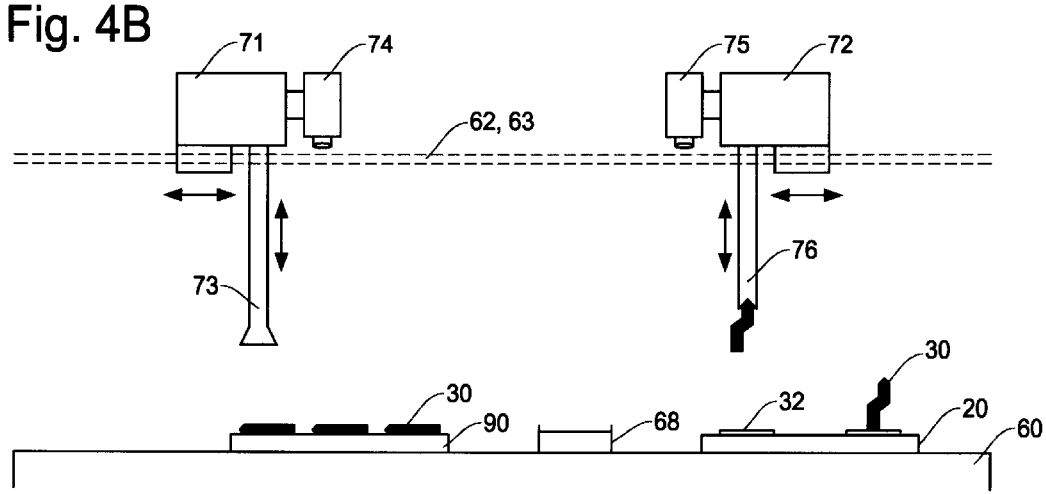

FIGS. 4A and 4B are schematic diagrams showing an example of pick and place mechanism and its process for picking the contact structures 30 and placing the same on a substrate 20 such as a probe card. FIG. 4A is a top view of the pick and place mechanism 60 and FIG. 4B is a front view of the pick and place mechanism for picking the contact structure 30 on the adhesive tape 90 and placing the contact structure on bonding locations 32 of the substrate 20 so that the contact structures 30 be bonded to the bonding locations 32 by a bonding machine (not shown).

In this example, the pick and place mechanism 60 is comprised of a first transfer mechanism 71 to pick, transfer and place the contact structures 30, a mobile arm 65 to allow movements of the transfer mechanism 71 in a Y direction, a second transfer mechanism 72 to pick, transfer and place the contact structures 30, a mobile arm 66 to allow movements of the transfer mechanism 72 in the Y direction, and rails 62 and 63 to allow movements of the mobile arms 65 and 66 in an X direction. Thus, the transfer mechanisms 71 and 72 are freely moveable in the X and Y directions on the pick and place mechanism 60. In FIG. 4, the pick and place mechanism 60 further includes a horizontal/vertical converter 68 for receiving contact structures 30 and converting the direction of the same.

The transfer mechanism 71 includes a suction arm 73 that performs suction (pick operation) and suction release (place operating) operations for the contact structures 30. The suction force is created, for example, by a negative pressure such as vacuum. The suction arm 73 moves in a Z direction (up-down direction). Similarly, the transfer mechanism 72 includes a suction arm 76 that performs suction (pick operation) and suction release (place operating) operations for the contact structures 30. The suction arm 76 moves in the Z direction. As shown in FIGS. 4A and 4B, cameras 74 and 75, having, for example CCD image sensors, are respectively attached to the transfer 72 to acquire image data to accurately control the movements of the transfer mechanism 71 and 72.

In operation, the adhesive tape 90 having the contact structures 30 and the substrate 20 having the bonding locations 32 are respectively positioned on the pick and place mechanism 60. Preferably, the adhesive tape 90 and the substrate are placed on XYZ stages (not shown), respectively, to be able to adjust the positions in X, Y and Z directions. As shown in FIG. 4A, the transfer mechanism 71 picks the contact structure 30 from the adhesive tape 90 by the suction force of the suction arm 73 and places the same on the converter 68. After placing the predetermined number of contact structures 30 on the converter 68, the contact structures 30 in the horizontal direction are converted their orientation to the vertical direction.

The transfer mechanism 72 then picks the contact structure in the converter 68 by the suction force of the suction arm 76. By the operation of the converter 68, the contact structure 30 is in the vertical direction as shown in FIG. 4B. The transfer mechanism 72 places the contact structure 30 on the bonding position 32 on the substrate 20. The contact structure 30 is bonded to the bonding location 32 through a bonding process in a known manner.

Figure 5A:
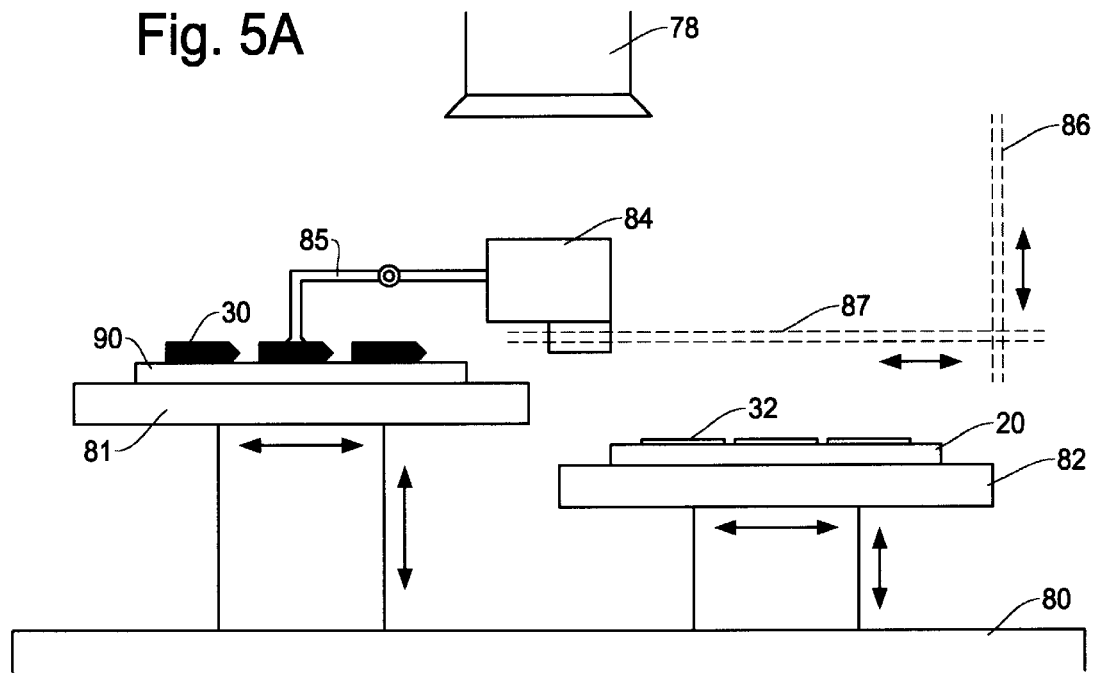
FIGS. 5A and 5B are schematic diagrams showing another example of pick and place mechanism and its process for picking the contact structures and placing the same on a substrate such as a probe card to mount the contact structures on the substrate.
Figure 5B:
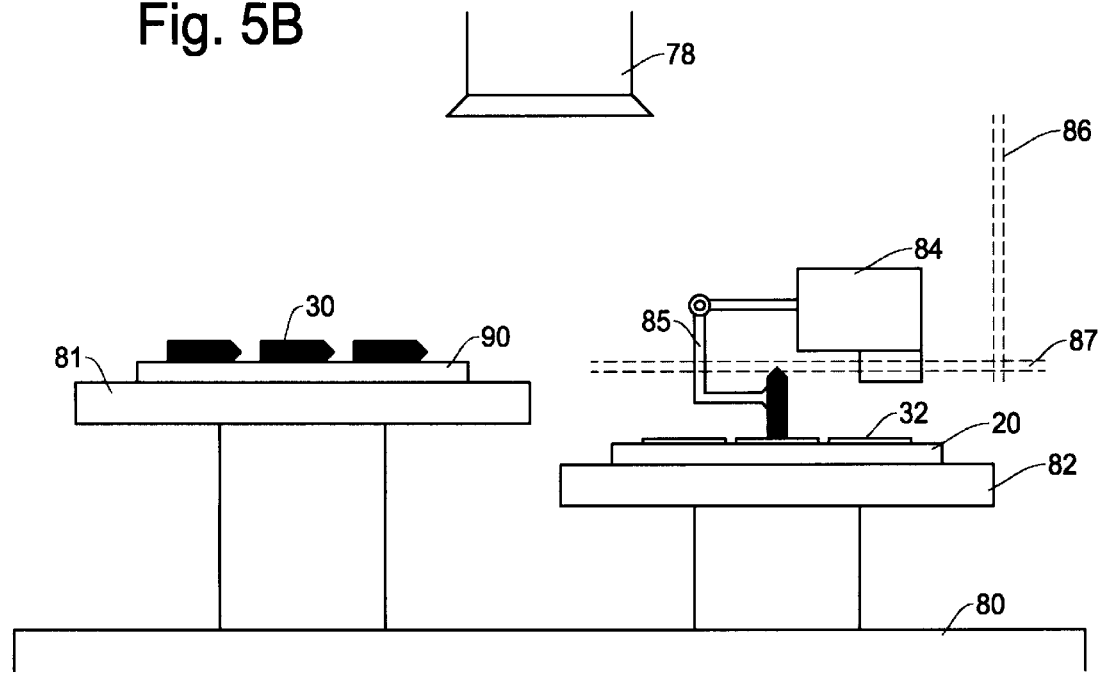

FIGS. 5A and 5B are schematic diagrams showing another example of process for picking the contact structures and placing the same on the substrate. FIG. 5A is a front view of the pick and place mechanism 80 showing the first half process of the pick and place operation. FIG. 5B is a front view of the pick and place mechanism 80 showing the second half process of the pick and place operation.

In this example, the pick and place mechanism 80 is comprised of a transfer mechanism 84 to pick and place the contact structures 30, mobile arms 86 and 87 to allow movements of the transfer mechanism 84 in X, Y and Z directions, tables 81 and 82 whose positions are adjustable in X, Y and Z directions, and a monitor camera 78 having, for example, a CCD image sensor therein. The transfer mechanism 84 includes a suction arm 85 that performs suction (pick operation) and suction release (place operating) operations for the contact structures 30. The suction force is created, for example, by a negative pressure such as vacuum. The suction arm 85 rotates in a predetermined angle such as 90 degrees.

In operation, the adhesive tape 90 having the contact structures 30 and the substrate 20 having the bonding locations 32 are positioned on the respective tables 81 and 82 on the pick and place mechanism 80. As shown in FIG. 5A, the transfer mechanism 84 picks the contact structure 30 from the adhesive tape 90 by suction force of the suction arm 85. After picking the contact structure 30, the suction arm 85 rotates by 90 degrees, for example, as shown in FIG. 5B. Thus, the orientation of the contact structure 30 is changed from the horizontal direction to the vertical direction. The transfer mechanism 84 then places the contact structure 30 on the bonding location 32 on the substrate 20. The contact structure 30 is bonded to the bonding location 32 through a bonding process in a known manner.

Figure 6:
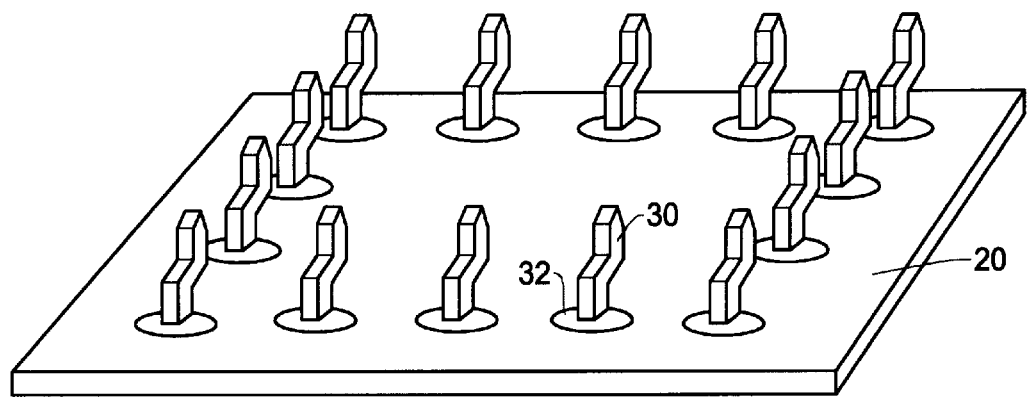
FIG. 6 is a perspective view showing an example of contact mechanism such as a contact probe having the contact structures produced by the process of the present invention.
Figure 7D:
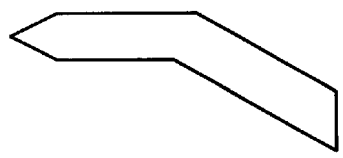
FIGS. 7A–7F are schematic diagrams showing examples of shape of contact structures to be produced through the production process of the present invention.
Figure 7C:
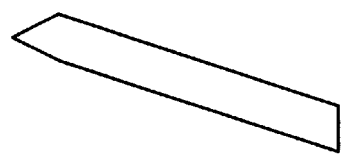
Figure 7B:
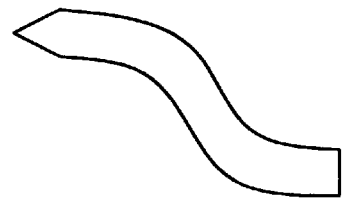
Figure 7F:
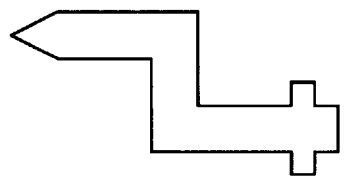
Figure 7A:
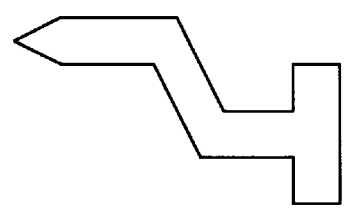
Figure 7E:
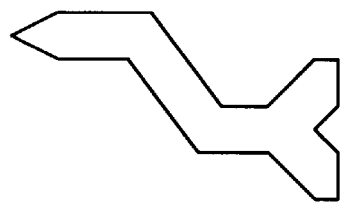

FIG. 6 is a perspective view showing an example of contact mechanism such as a contact probe having the contact structures produced in the present invention. Each of the contact structures 30 is attached to the surface of the bonding location 32 through the bonding process. Examples of bonding process include brazing, ultrasonic welding, conductive adhesive, soldering, and micro welding.

FIGS. 7A–7F are schematic diagrams showing examples of shape of contact structures to be produced through the production process of the present invention. FIGS. 7A–7F merely show examples and are not exhaustive, and thus, other shapes of contact structures are also feasible. When mounted on a contact mechanism such as a probe card made of printed circuit board, and pressed against the contact targets such as contact pads on a semiconductor wafer to be tested, the contact structures in FIGS. 7A–7F exhibit contact force by spring effects and can produce scrubbing effects against the surface of the contact targets, depending on the target metallurgy of contact.

According to the present invention, the production process is able to produce a large number of contact structures in a horizontal direction on the silicon substrate by using relatively simple technique. Such contact structures produced are removed from the substrate and mounted on a contact mechanism such as a probe card in a vertical direction. The contact structures produced by the present invention are low cost and high efficiency and have high mechanical strength and reliability. The contact structures produced by the method of the present invention are advantageously applied in testing a semiconductor wafer, packaged LSI and the like including burn-in testing.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method for producing contact structures, comprising the following steps of:
    forming a sacrificial layer on a surface of a silicon substrate;
    forming an conductive layer made of electric conductive material on the sacrificial layer;
    forming a photoresist layer on the conductive layer;
    aligning a photo mask over the photoresist layer and exposing the photoresist layer with ultraviolet light through the photo mask, the photo mask including an image of the contact structures;
    developing the image on the photoresist layer which has openings on the surface of the photoresist layer;
    forming the contact structures made of electric conductive material in the openings by a deposition process;
    stripping the photoresist layer; and
    removing the sacrificial layer and the conductive layer by an etching process so that the contact structures are separated from the silicon substrate.

2. A method for producing contact structures as defined in claim 1, in the aligning and exposing step, the photoresist layer is exposed by an electron beam or X-rays through the photo mask.

3. A method for producing contact structures as defined in claim 1, in the aligning and exposing step, the photoresist layer is directly exposed by an electron beam, X-ray or laser light to define the image of the contact structure thereon.

4. A method for producing contact structures as defined in claim 1, further including a step of forming an adhesion promoter layer between the sacrificial layer and the conductive layer.

5. A method for producing contact structures as defined in claim 1, the etching process is formed of a first etching process for separating the contact structures from the silicon substrate and a second etching process for separating the contact structures from the conductive layer.

6. A method for producing contact structures as defined in claim 1, wherein the sacrificial layer is made of silicon dioxide.

7. A method for producing contact structures as defined in claim 1, wherein the conductive layer is made of copper (Cu) or nickel (Ni).

8. A method for producing contact structures as defined in claim 1, wherein the photoresist material is Novolak (M-Cresol-formaldehyde), PMMA (Poly Methyl Methacrylate), SU-8 or photo sensitive polyimide.

9. A method for producing contact structures as defined in claim 1, wherein the contact structures are made of copper (Cu), nickel (Ni), aluminum (Al), rhodium (Rh), palladium (Pd) or tungsten (W).

10. A method for producing contact structures as defined in claim 1, wherein the electric conductive material for the conductive layer is different from the electric conductive material for the contact structures.

11. A method for producing contact structures as defined in claim 2, wherein the adhesion promoter layer is made of chromium (Cr) or titanium (Ti).

12. A method for producing contact structures, comprising the following steps of:
    forming a sacrificial layer on a surface of a silicon substrate;
    forming a conductive layer made of electric conductive material on the sacrificial layer;
    forming the contact structures through a photolithography process, the contact structures being in a horizontal direction on the silicon substrate; and
    applying an adhesive tape on the contact structure and removing the contact structures from the silicon substrate and the conductive layer;
    wherein the photolithography process includes steps of photoresist coating, masking, exposure, photoresist stripping and conductive material deposition.

13. A method for producing a contact mechanism having contact structures each of which is able to exhibit a spring force for establishing electrical contact with a contact target, comprising the following steps of:
    forming a sacrificial layer on a surface of a silicon substrate;
    forming a conductive layer made of electric conductive material on the sacrificial layer;
    forming the contact structures through a photolithography process, the contact structures being in a horizontal direction on the silicon substrate;
    transferring the contact structures from the silicon substrate to an adhesive tape;
    positioning the adhesive tape having the contact structures and removing the contact structures therefrom;
    orienting the contact structures in a predetermined direction;
    positioning a contact mechanism having bonding locations for mounting the contact structures thereon; and
    placing the contact structure on a predetermined position on the bonding location of the contact mechanism and bonding the contact structure to the bonding location.

14. A method for producing a contact mechanism as defined in claim 13, wherein the photolithography process includes steps of photoresist coating, masking, exposure, photoresist stripping and conductive material deposition.

15. A method for producing a contact mechanism as defined in claim 13, further including a step of forming an adhesion promoter layer between the sacrificial layer and the conductive layer, the adhesion promoter layer being made of chromium (Cr) or titanium (Ti).

16. A method for producing a contact mechanism as defined in claim 14, the photolithography process further including a step of planarizing surfaces of the contact structures after the conductive material deposition.

17. A method for producing a contact mechanism as defined in claim 14, wherein conductive material deposition step in the photolithography process is an electroplating process utilizing the conductive layer.

18. A method for producing a contact mechanism as defined in claim 13, wherein the sacrificial layer is made of silicon dioxide.

19. A method for producing a contact mechanism as defined in claim 13, wherein the conductive layer is made of copper (Cu) or nickel (Ni).

20. A method for producing a contact mechanism as defined in claim 14, wherein material for the photoresist is Novolak (M-Cresol-formaldehyde), PMMA (Poly Methyl Methacrylate) or photo sensitive polyimide.

21. A method for producing a contact mechanism as defined in claim 13, wherein the contact structures are made of copper (Cu), nickel (Ni), aluminum (Al), palladium (Pd) or tungsten (W).

22. A method for producing a contact mechanism as defined in claim 13, wherein the electric conductive material for the conductive layer is different from the electric conductive material for the contact structures.

* * * * *